United States Patent
Kojima et al.

(10) Patent No.: US 11,867,766 B2
(45) Date of Patent: Jan. 9, 2024

(54) BATTERY SYSTEM

(71) Applicant: DENSO CORPORATION, Kariya (JP)

(72) Inventors: Toshiki Kojima, Kariya (JP); Masakazu Kouda, Kariya (JP); Akira Sumi, Kariya (JP)

(73) Assignee: DENSO CORPORATION, Kariya (JP)

( * ) Notice: Subject to any disclaimer, the term of this patent is extended or adjusted under 35 U.S.C. 154(b) by 303 days.

(21) Appl. No.: 17/330,863

(22) Filed: May 26, 2021

(65) Prior Publication Data
US 2021/0278468 A1 Sep. 9, 2021

Related U.S. Application Data

(63) Continuation of application No. PCT/JP2019/046586, filed on Nov. 28, 2019.

(30) Foreign Application Priority Data

Dec. 3, 2018 (JP) .................... 2018-226818

(51) Int. Cl.
| | |
|---|---|
| *G01R 31/382* | (2019.01) |
| *G01R 31/396* | (2019.01) |
| *B60L 58/12* | (2019.01) |
| *H01M 10/48* | (2006.01) |
| *H02J 7/02* | (2016.01) |

(52) U.S. Cl.
CPC ............ *G01R 31/382* (2019.01); *B60L 58/12* (2019.02); *G01R 31/396* (2019.01); *H01M 10/48* (2013.01); *H01M 10/482* (2013.01); *H02J 7/02* (2013.01)

(58) Field of Classification Search
None
See application file for complete search history.

(56) References Cited

U.S. PATENT DOCUMENTS

| | | | | |
|---|---|---|---|---|
| 9,651,625 | B2 * | 5/2017 | Kikuchi | ............... B60L 3/04 |
| 2014/0312913 | A1 | 10/2014 | Kikuchi et al. | |
| 2018/0095140 | A1 * | 4/2018 | Park | ............... G01R 31/367 |

FOREIGN PATENT DOCUMENTS

JP 2013-085363 A 5/2013

OTHER PUBLICATIONS

Dec. 24, 2019 International Search Report issued in International Patent Application No. PCT/JP2019/046586.

* cited by examiner

*Primary Examiner* — Roy Y Yi
(74) *Attorney, Agent, or Firm* — Oliff PLC

(57) ABSTRACT

A battery system includes a plurality of battery modules and a control apparatus. The battery includes a battery group that includes two or more battery modules including battery units and battery monitoring units. The battery monitoring units of the battery modules being connected to each other via a communication line. The battery modules perform wired communication via the communication line. The battery group further includes a wireless receiving unit and a wireless transmitting unit. The wireless receiving unit wirelessly receives a command signal transmitted from the control apparatus. The wireless transmitting unit wirelessly transmits, to the control apparatus, a data signal including module identification information differing for each battery module. In the battery group, the wireless receiving unit is provided in a single battery module of the battery modules and the wireless transmitting unit is provided in a single battery module of the battery modules.

15 Claims, 8 Drawing Sheets

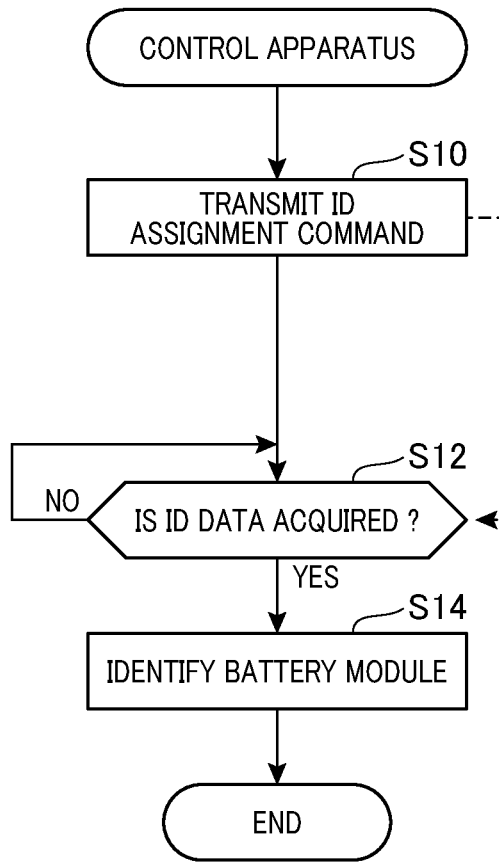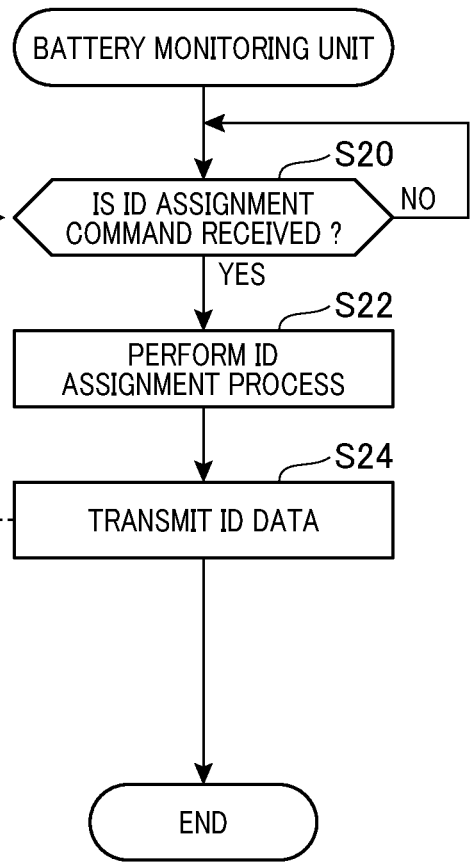

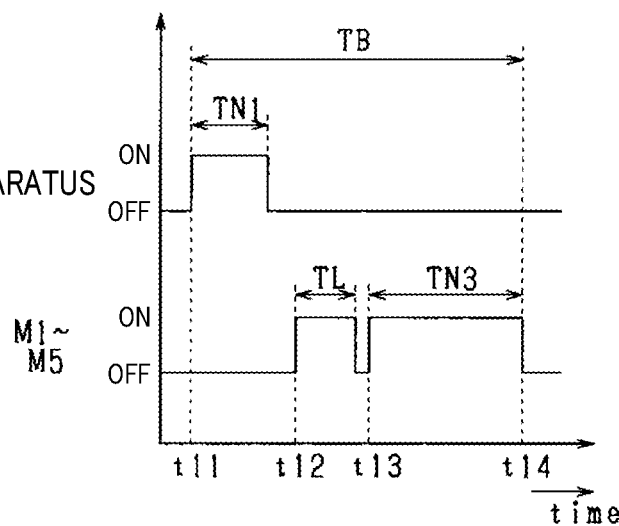
FIG.4A CONTROL APPARATUS
FIG.4B M1~M5
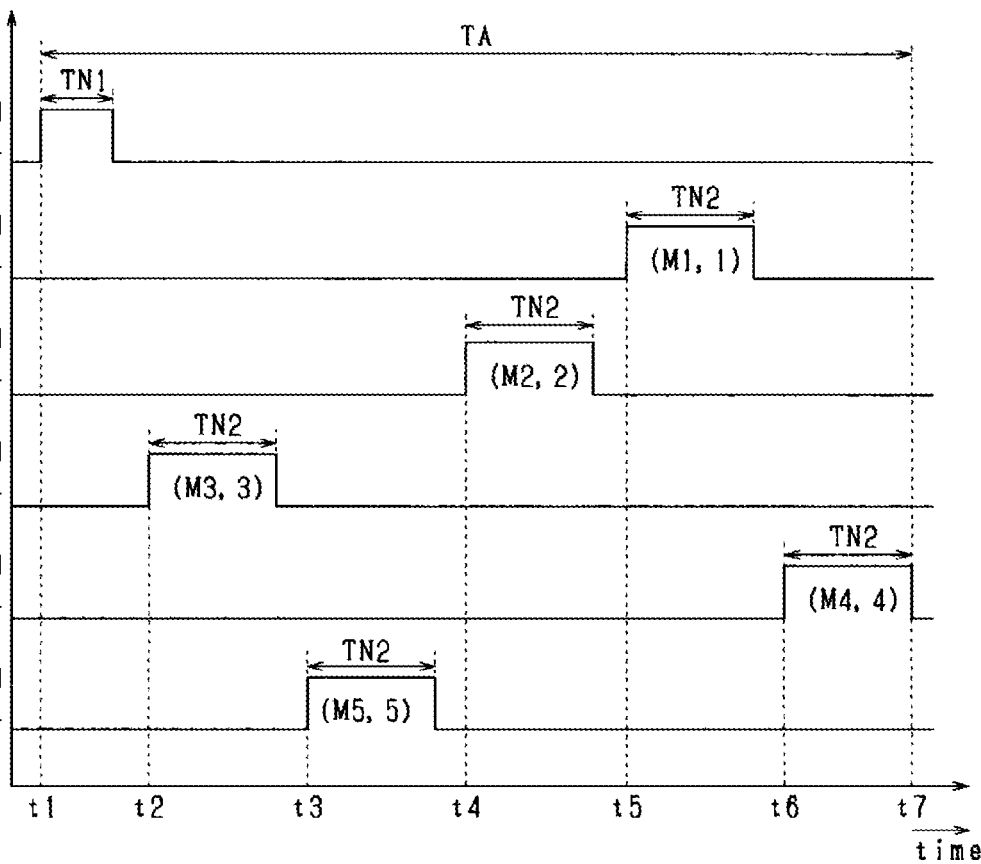
FIG.5A
FIG.5B M1
FIG.5C M2
FIG.5D M3
FIG.5E M4
FIG.5F M5

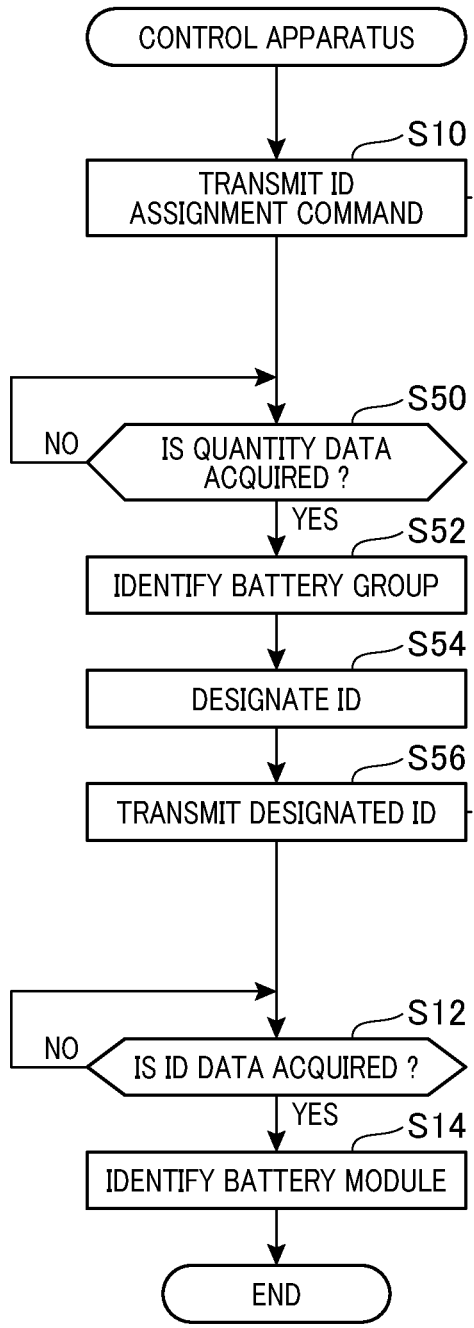
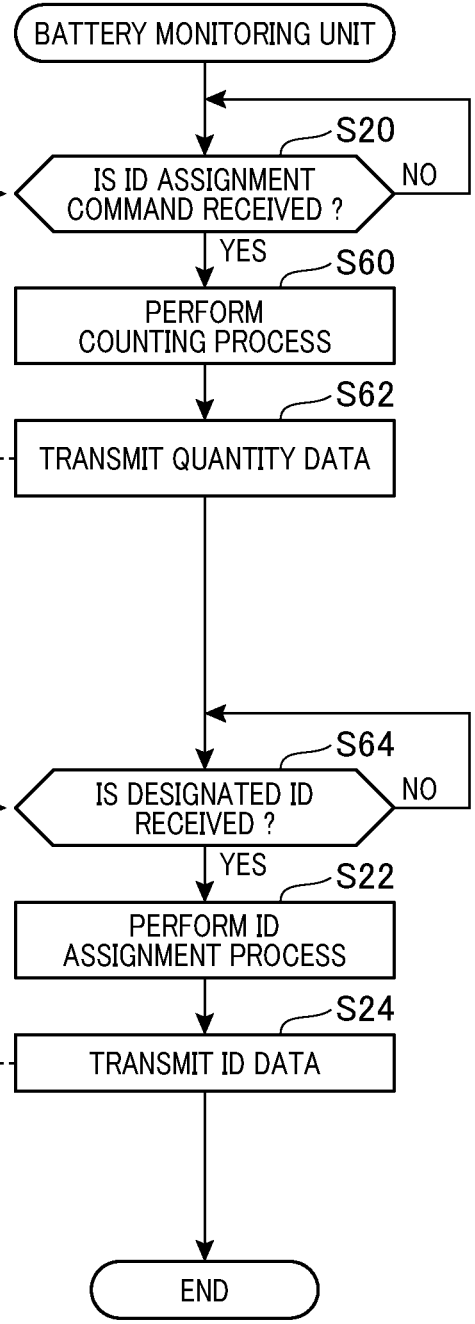

BATTERY SYSTEM

CROSS-REFERENCE TO RELATED APPLICATION

The present application is a continuation application of International Application No. PCT/JP2019/046586, filed on Nov. 28, 2019, which claims priority to Japanese Patent Application No. 2018-226818, filed on Dec. 3, 2018. The contents of these applications are incorporated herein by reference in their entirety.

BACKGROUND

Technical Field

The present disclosure relates to a battery system.

Background Art

Conventionally, in electric vehicles, for example, a battery system that includes a plurality of battery modules to support a wide range of electrification is known. In such a battery system, a control apparatus that controls each battery module monitors a charging state and performs failure diagnosis for each battery module.

SUMMARY

The present disclosure provides a battery system that includes a plurality of battery modules and a control apparatus. The battery includes a battery group that includes two or more battery modules including battery units and battery monitoring units. The battery monitoring units of the battery modules being connected to each other via a communication line. The battery modules perform wired communication via the communication line. The battery group further includes a wireless receiving unit and a wireless transmitting unit. The wireless receiving unit wirelessly receives a command signal transmitted from the control apparatus. The wireless transmitting unit wirelessly transmits, to the control apparatus, a data signal including module identification information differing for each battery module. In the battery group, the wireless receiving unit is provided in a single battery module of the battery modules and the wireless transmitting unit is provided in a single battery module of the battery modules.

BRIEF DESCRIPTION OF THE DRAWINGS

In the accompanying drawings:

FIGS. 2A and 2B are flowcharts of an identification process and an identification information generation process according to the first embodiment;

FIG. 3 is a diagram of a relationship among a battery module, identification information, and transmission data;

FIGS. 4A and 4B are timing charts of transitions in processing states in the identification process according to the first embodiment;

FIGS. 5A to 5F are timing charts of transitions in processing states in an identification process in a comparison example;

FIGS. 7A and 7B are flowcharts of an identification process and an identification information generation process according to the second embodiment;

FIG. 8 is a diagram of a relationship among a battery group, module quantity information, and identification information;

DESCRIPTION OF THE EMBODIMENTS

Figure 1:
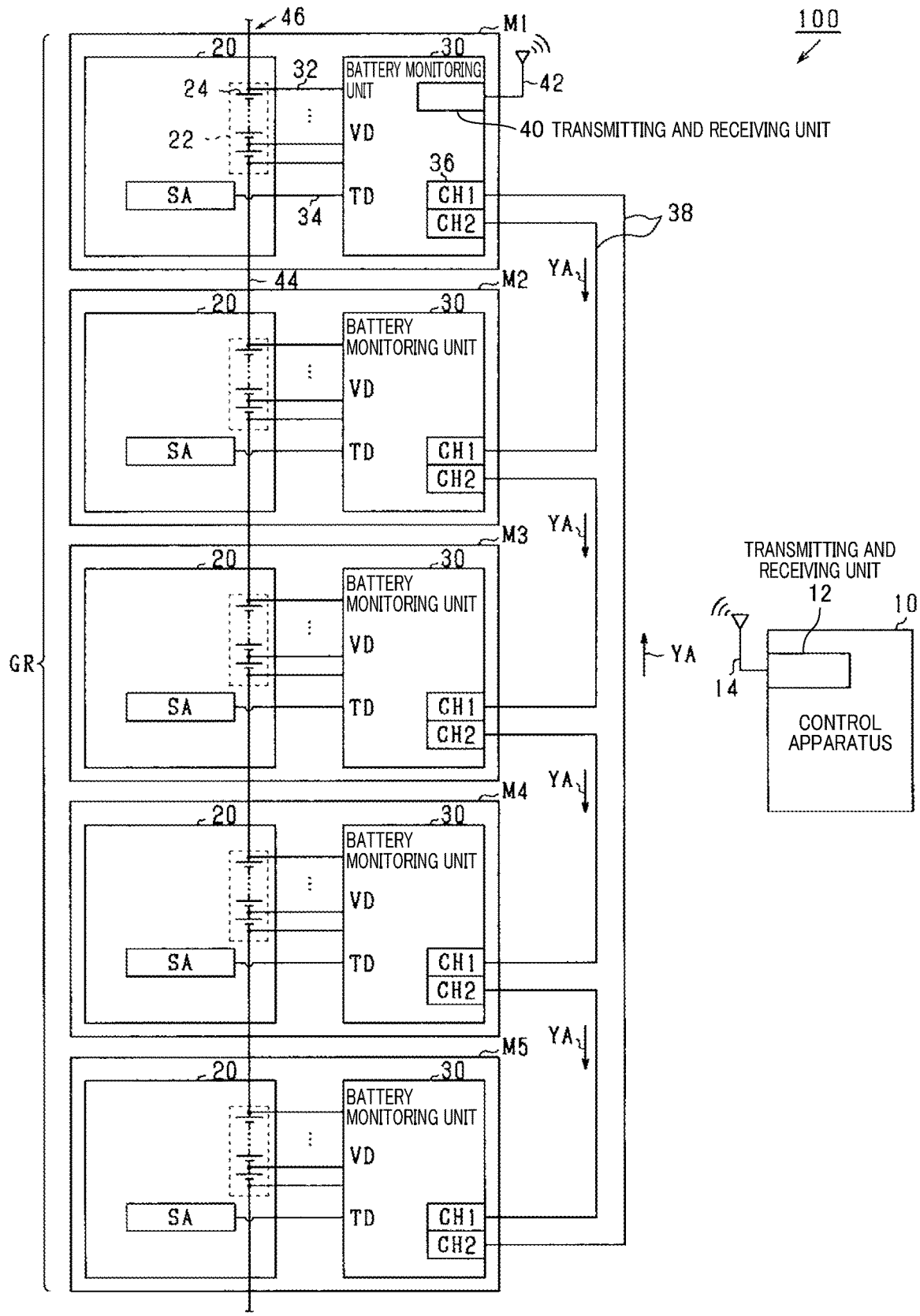
FIG. 1 is a configuration diagram of an overview of a power supply system of a vehicle according to a first embodiment.

Conventionally, in electric vehicles, for example, a battery system that includes a plurality of battery modules to support a wide range of electrification (such as JP-A-2013-085363) is known. In such a battery system, a control apparatus that controls each battery module monitors a charging state and performs failure diagnosis for each battery module. Therefore, each battery module is required to be identified.

In a technology described in JP-A-2013-085363, unique identification information is set in advance for each battery module. The control apparatus acquires the above-described identification information by individually wirelessly communicating with each battery module and identifies each battery module using the identification information.

However, in the battery system that includes a plurality of battery modules, when the control apparatus individually wirelessly communicates with each battery module, a period that is required for identification of the battery modules becomes long as a result of lengthening of a communication period. For example, in an onboard battery system, identification of the battery modules is performed at startup of a vehicle.

Therefore, if a period that is required for startup of the vehicle becomes long as a result of the period that is required for identification of the battery modules becoming long, a user may become impatient. A technology that is capable of shortening the period that is required for identification of the battery modules is desired.

It is thus desired to provide a battery system that is capable of shortening a period that is required for identification of battery modules.

An aspect of the present disclosure provides a battery system that includes a plurality of battery modules and a control apparatus. The plurality of battery modules include a battery unit and a battery monitoring unit. The plurality of battery modules include a battery group that includes two or more battery modules including battery units and battery monitoring units. The battery monitoring units of the two or more battery modules in the battery group are connected to each other via a communication line. The two or more battery modules in the battery group perform wired communication via the communication line. The battery group further includes a wireless receiving unit and a wireless transmitting unit. The wireless receiving unit wirelessly receives a command signal that is transmitted from the control apparatus. The wireless transmitting unit wirelessly transmits, to the control apparatus, a data signal that includes module identification information that differs for each battery module. In the battery group, the wireless receiving unit is provided in a single battery module of the two or more battery modules and the wireless transmitting unit is provided in a single battery module of the two or more battery modules.

The battery modules in the battery group care capable of wired communication among the battery modules. Therefore, the battery modules are not required to individually wirelessly communicate with the control apparatus. In the aspect of the present disclosure, the wireless receiving unit is provided in a single battery module and the wireless transmitting unit is provided in a single battery module of the two or more battery modules. Therefore, the number of times of communication in which the control apparatus wirelessly communicates with the battery modules to acquire the module identification information can be reduced. A communication period can thereby be shortened. Consequently, a period required for identification of the battery modules can be shortened.

First Embodiment

A first embodiment actualizing a battery system of the present disclosure will hereinafter be described with reference to the drawings. A battery system 100 according to the present embodiment is mounted to a vehicle.

As shown in FIG. 1, the battery system 100 includes five battery modules M1 to M5 and a control apparatus 10. The battery modules M1 to M5 each include a battery unit 20 and a battery monitoring unit 30.

The battery unit 20 includes an assembled battery (also called a battery pack) 22 in which a plurality of battery cells 24 are connected in series. The assembled batteries 22 of the battery modules M1 to M5 are connected in series via a bus bar 44, thereby configuring a series connection body 46.

A temperature sensor SA that detects a temperature of the assembled battery 22 is provided near the assembled battery 22. The temperature sensor SA detects the temperature of the assembled battery 22 and outputs temperature data TD that is a voltage signal based on the detected temperature. Here, for example, a temperature-sensitive diode or a thermistor can be used as the temperature sensor SA.

The battery monitoring unit 30 monitors the assembled battery 22. The battery monitoring unit 30 is connected to both electrodes of each battery cell 24 configuring the assembled battery 22 via a detection line 32. The battery monitoring unit 30 detects a voltage (inter-terminal voltage) of each battery cell 24 and acquires cell voltage data VD that is a voltage signal based on each battery cell 24. In addition, the battery monitoring unit 30 is connected to the temperature sensor SA via an electrical wiring 34 and acquires the temperature data TD from the temperature sensor SA.

The battery monitoring unit 30 is provided with a connector 36. The connector 36 has a reception terminal CH1 and a transmission terminal CH2 for performing wired communication with another battery module. The reception terminal CH1 is connected to the transmission terminal CH2 of another battery module via a communication line 38. The transmission terminal CH2 is connected to the reception terminal CH1 of another battery module via the communication line 38. As a result, two or more battery modules M1 to M5 configure a battery group GR that is capable of wired communication via the communication line 38.

In the battery group GR, the battery monitoring units 30 of the battery modules M1 to M5 are connected in a ring topology by the communication line 38. The battery monitoring unit 30 of each of battery modules M1 to M5 transmits signals, such as a command signal and a data signal, in a transmission direction YA that is prescribed in advance using the communication line 38 that is arranged in a ring topology.

According to the present embodiment, the battery modules M1 to M5 are arranged such as to be arrayed in this order from a high-voltage side toward a low-voltage side. The signals, such as the command signals and the data signals, are transmitted among the battery modules M1 to M5 in the transmission direction YA from the battery module M1 on the high-voltage side toward the battery module M5 on the low-voltage side. A signal that is transmitted to the battery module M5 is transmitted between the battery modules M1 and M5 in the transmission direction YA from the battery module M5 on the low-voltage side toward the battery module M1 on the high-voltage side.

The battery monitoring unit 30 includes a transmitting and receiving unit 40 that is capable of wirelessly communicating with (capable of wirelessly receiving from and wirelessly transmitting to) the control apparatus 10, and an antenna 42. The battery monitoring unit 30 wirelessly transmits the data signal to the control apparatus 10 using the transmitting and receiving unit 40 and the antenna 42. The data signal includes, in addition to the cell voltage data VD and the temperature data TD, identification information ID for identifying each of the battery modules M1 to M5.

In addition, the battery monitoring unit 30 wirelessly receives various command signals that are transmitted from the control apparatus 10 using the transmitting and receiving unit 40 and the antenna 42. Here, according to the present embodiment, the transmitting and receiving unit 40 corresponds to a "wireless transmitting unit" and a "wireless receiving unit". The identification information ID corresponds to "module identification information".

Next, the control apparatus 10 will be described. The control apparatus 10 is mainly configured by a microcomputer that is configured by a central processing unit (CPU), a read-only memory (ROM), a random access memory (RAM), and the like. The control apparatus 10 individually controls the battery modules M1 to M5 by running various control programs stored in the ROM.

The control apparatus 10 includes a transmitting and receiving unit 12 and an antenna 14, and is configured to be capable of communicating with the battery monitoring unit 30. Specifically, the control apparatus 10 wirelessly receives the data signal that is wirelessly transmitted by the battery monitoring unit 30 using the transmitting and receiving unit 12 and the antenna 14. The control apparatus 10 controls the assembled battery 22 using the received cell voltage data VD and temperature data TD.

For example, the control apparatus 10 calculates a charging state (state of charge [SOC]) of the assembled battery 22 using the received cell voltage data VD and temperature data TD. Then, the control apparatus 10 wirelessly transmits a command signal that includes a command for preventing the assembled battery 22 from becoming over-charged or over-discharged to the battery monitoring unit 30, using the transmitting and receiving unit 12 and the antenna 14.

Here, in the battery system 100, the control apparatus 10 is required to identify each of the battery modules M1 to M5 to monitor the charging state and perform failure diagnosis for each of the battery modules M1 to M5. For example, a case in which the battery monitoring unit 30 includes the transmitting and receiving unit 40 and the antenna 42 in each of the battery modules M1 to M5 is examined. In this case, the control apparatus 10 can identify each of the battery modules M1 to M5 by individually wirelessly communicating with the battery monitoring unit 30 of each of the battery modules M1 to M5.

However, when the control apparatus 10 individually wirelessly communicates with each of the battery modules M1 to M5 when identifying each of the battery modules M1 to M5, an issue occurs in that a period required for identification of the battery modules M1 to M5 becomes long as a result of lengthening of a communication period.

In the onboard battery system 100, because identification of the battery modules M1 to M5 is performed at startup of the vehicle, if a period that is required for startup of the vehicle becomes long as a result of the period that is required for identification of the battery modules M1 to M5 becoming long, a user may experience discomfort. A technology for shortening the period that is required for identification of the battery modules M1 to M5 is desired.

To solve the above-described issue, in the battery system 100 according to the present embodiment, in the battery group GR, the transmitting and receiving unit 40 is provided in a single battery module M1 among the five battery modules M1 to M5 that are included in the battery group GR. Specifically, the transmitting and receiving unit 40 is provided in only the battery module M1. The battery monitoring unit 30 is commonized among the battery modules M2 to M5 that are not provided with the transmitting and receiving unit 40.

The battery module M1 receives the command signal from the control apparatus 10 through the transmitting and receiving unit 40 and the antenna 42. The battery modules M2 to M5 that are not provided with the transmitting and receiving unit 40 receive the command signal from the battery module M1 via the communication line 38 and transmit the data signals to the battery module M1 via the communication line 38. The battery module M1 collectively transmits the data signals of all of the battery modules M1 to M5 included in the battery group GR to the control apparatus 10 through the transmitting and receiving unit 40 and the antenna 42.

As a result of the battery system 100 according to the present embodiment, the number of times of communication in which the control apparatus 10 wirelessly communicates with each of the battery modules M1 to M5 to acquire the identification information ID of each of the battery modules M1 to M5 can be reduced. The communication period can thereby be shortened. As a result, an identification period TB (see FIGS. 4A and 4B) that is required for identification of the battery modules M1 to M5 can be shortened.

FIGS. 2A and 2B show a flowchart of an identification process and an identification information generation process according to the present embodiment. The identification information generation process is a process for generating the identification information ID corresponding to each of the battery modules M1 to M5 and is performed by the battery monitoring unit 30. The identification process is a process for identifying each of the battery modules M1 to M5 using the identification information ID generated in the identification information generation process and is performed by the control apparatus 10.

FIG. 2A shows the flowchart of the identification process by the control apparatus 10. FIG. 2B shows the flowchart of the identification information generation process by the battery monitoring unit 30. The control apparatus 10 and the battery monitoring unit 30 perform each process at startup of the vehicle, that is, when an ignition switch of the vehicle is switched to an on state.

First, the identification information generation process by the battery monitoring unit will be described. When the identification information generation process is started, first, at step S20, the battery monitoring unit 30 determines whether an ID assignment command is received from the control apparatus 10.

When a negative determination is made at step S20, step S20 is repeated. Meanwhile, when a positive determination is made at step S20, at step S22, an ID assignment process is performed. In the ID assignment process, the identification information ID is assigned to each of the battery modules M1 to M5 using an order of communication. Specifically, as shown in FIG. 3, when the ID assignment command is received, the battery module M1 assigns identification information ID of 1 that is designated by the ID assignment command to itself. The battery module M1 transmits, to the battery module M2 on the low-voltage side, information of (M1, 1) in which the battery module M1 and the identification information ID of 1 are associated with each other.

When the information of (M1, 1) is acquired, the battery module M2 assigns identification information ID of 2 that follows the identification information ID of 1 in the information of (M1, 1) to itself. The battery module M2 transmits, to the battery module M3 on the low-voltage side, information of (M1, 1) and (M2, 2) in which information (M2, 2) in which the battery module M2 and the identification ID of 2 are associated with each other is added to the acquired information of (M1, 1).

The battery modules M3 to M5 similarly repeat assignment of the identification information ID and transmission of information. As a result, information of (M1, 1), (M2, 2) (M3, 3), (M4, 4), and (M5, 5) is transmitted to the battery module M1.

At subsequent step S24, an ID data signal that includes the information of (M1, 1), (M2, 2), (M3, 3), (M4, 4), and (M5, 5) is transmitted to the control apparatus 10, and the identification information generation process is ended.

Next, the identification process by the control apparatus 10 will be described. When the identification process is started, first, at step S10, the control apparatus 10 transmits the ID assignment command to the battery monitoring unit 30. At subsequent step S12, the control apparatus 10 determines whether the ID data signal is acquired from the battery monitoring unit 30.

When a negative determination is made at step S12, step S12 is repeated. Meanwhile, when a positive determination is made at step S12, at step S14, each of the battery modules M1 to M5 included in the battery group GR are identified based on the identification information ID that is included in the ID data signal acquired at step S12, and the identification process is ended.

When the identification process is ended, the control apparatus 10 transmits, to the battery group GR, a transmission command for the cell voltage data VD and the temperature data TD of each of the battery modules M1 to M5, and acquires these pieces of data. The control apparatus 10 individually controls the battery modules M1 to M5 using the identification information ID and these pieces of data.

Next, FIGS. 4A and 4B show transitions in processing states of the control apparatus and the battery monitoring unit 30 in the identification process. In FIGS. 4A and 4B, a state in which the control apparatus 10 or the battery monitoring unit 30 is performing a process is expressed as an on state, and a state in which the control apparatus 10 or the battery monitoring unit 30 is not performing a process is expressed as an off state. This similarly applies to FIGS. 5A to 5F.

FIG. 4A shows the transitions in the processing state of the control apparatus 10. FIG. 4B shows the transitions in the processing state of the battery monitoring unit 30 of each of the battery modules M1 to M5. In FIG. 4B, the processing state is the on state when at least one battery monitoring unit 30 among the battery monitoring units 30 of the battery modules M1 to M5 is performing a process, and the off state when none of the battery monitoring units 30 are performing a process.

FIG. 5A to 5F show, as a comparison example, the transitions in the processing states of the control apparatus 10 and the battery monitoring unit 30 in a case in which the transmitting and receiving unit 40 is provided in each of the battery modules M1 to M5 included in the battery group GR, and the battery modules M1 to M5 individually wirelessly communicate with the control apparatus 10. FIG. 5A shows the transitions in the processing state of the control apparatus 10. FIGS. 5B to 5F show the transitions in the processing state of the battery monitoring unit 30 of each of the battery modules M1 to M5.

In the comparison example, as shown in FIGS. 5A to 5F, when the ID assignment command is transmitted from the control apparatus 10 at time t1, the battery modules M1 to M5 individually wirelessly communicate with the control apparatus 10. Because the control apparatus 10 cannot simultaneously wirelessly communicate with the plurality of battery modules M1 to M5, the control apparatus 10 wirelessly communicates with the battery modules M1 to M5 at separate timings.

Therefore, in the comparison example, an identification period TA that is required for the identification process includes five second communication periods TN2 that are required for a single battery module to wirelessly communicate with the control apparatus 10. An issue occurs in that the identification period TA becomes long. Here, as shown in (Expression 1), the second communication period TN2 is longer than a first communication period TN1 that is required for the communication apparatus 10 to transmit the ID assignment command.

$TN2>TN1$ (Expression 1)

Specifically, at time t2, the battery module M3 starts wireless communication with the control apparatus 10. At subsequent time t3, the battery module M5 starts wireless communication with the control apparatus 10. At subsequent time t4, the battery module M2 starts wireless communication with the control apparatus 10.

In addition, at subsequent time t5, the battery module M1 starts wireless communication with the control apparatus 10, and at subsequent time t6, the battery module M4 starts wireless communication with the control apparatus 10. Because an order in which the battery modules M1 to M5 wirelessly communicate with the control apparatus 10 is random, the control apparatus 10 cannot assign the identification information ID to the battery modules M1 to M5 in the order of wireless communication.

Therefore, in the comparison example, the identification information ID is set in advance in the battery monitoring units 30 of the battery modules M1 to M5, and the identification information ID is transmitted to the control apparatus 10. Therefore, an issue occurs in that the battery monitoring units 30 that are included in the battery modules M1 to M5 cannot be commonized. Here, the identification period TA in the comparison example is a period from time t1 to time t7 after elapse of the second communication period TN2 from time t6.

In contrast, according to the present embodiment, as shown in FIGS. 4A and 4B, when the ID assignment command is transmitted from the control apparatus 10 at time t11, only the battery module M1 wirelessly communicates with the control apparatus 10. Specifically, when the ID assignment command is received, at time t12, the battery monitoring unit 30 starts wired communication among the battery modules M1 to M5. At subsequent t13, the battery module M1 starts wireless communication with the control apparatus 10.

According to the present embodiment, in the wireless communication between the battery module M1 and the control apparatus 10, data of the battery modules M1 to M5 that are included in the battery group GR is transmitted. Therefore, as shown in (Expression 2), a third communication period TN3 that is required for the battery module M1 to wirelessly communicate with the control apparatus 10 is longer than the second communication period TN2.

$TN3>TN2$ (Expression 2)

However, the period that is required for data transmission is sufficiently shorter than the second communication period TN2 that includes the period required until wireless communication is established. In addition, a wired communication period TL that is required by the battery monitoring unit 30 for wired communication is sufficiently shorter than the second communication period TN2. Therefore, as shown in (Expression 3), an added period of the wired communication period TL and the third communication period TN3 is shorter than twice the second communication period TN2.

$2 \times TN2>TL+TN3$ (Expression 3)

As a result, the identification period TB according to the present embodiment can be shortened compared to the identification period TA of the comparison example. Here, the identification period TB according to the present embodiment is a period from time t11 to time t14 after elapse of the third communication period TN3 from time t13.

In addition, according to the present embodiment, because the identification information ID is assigned to each of the battery modules M1 to M5 as a result of wired communication by the battery monitoring units 30, the identification information ID is not required to be set in the battery monitoring unit 30 of each of the battery modules M1 to M5. Therefore, in the battery modules M2 to M5, the battery monitoring unit 30 that is included in each of the battery modules M2 to M5 can be commonized.

According to the present embodiment described in detail above, the following effects can be achieved.

Because the battery modules M1 to M5 are capable of wired communication among the battery modules M1 to M5, the battery modules M1 to M5 are not required to individually wirelessly communicate with the control apparatus 10. According to the present embodiment, the transmitting and receiving unit 40 is provided in only the battery module M1, among the five battery modules M1 to M5 that are included in the battery group GR. Therefore, the number of times of communication in which the control apparatus 10 wirelessly communicates with the battery modules M1 to M5 to acquire the identification information ID can be reduced. The communication period can thereby be shortened. As a result, the identification period TB that is required for identification of the battery modules M1 to M5 can be shortened.

According to the present embodiment, the transmitting and receiving unit 40 is provided in only the battery module M1, among the five battery modules M1 to M5 that are included in the battery group GR. The transmitting and receiving unit 40 is not provided in the other battery modules M2 to M5. Therefore, the number of transmitting and receiving units 40 in the battery system 100 can be reduced.

According to the present embodiment, the battery modules M1 to M5 are connected in a ring topology by the communication line 38. The battery monitoring unit 30 of each of the battery modules M1 to M5 transmits signals, such as the command signal and the data signal, along the communication line 38 that is arranged in the ring topology in the transmission direction YA that is prescribed in advance. That is, in the battery group GR, the order of communication for wired communication is prescribed in advance. Therefore, the identification information ID can be assigned to each of the battery modules M1 to M5 using this order.

In particular, according to the present embodiment, among the battery modules M1 to M5, the transmission direction YA is set to a direction from the battery module M1 on the high-voltage side toward the battery module M5 on the low-voltage side. Therefore, the identification information ID can be assigned to each of the battery modules M1 to M5 based on potential information ΔV that indicates a potential of the battery unit 20 of each of the battery modules M1 to M5 relative to a ground voltage.

In the battery system 100 that includes the plurality of battery modules M1 to M5, commonization of the battery monitoring unit 30 that is included in the battery modules M1 to M5 is desired for cost reduction and the like. However, the battery monitoring unit 30 cannot be commonized between the battery module in which the transmitting and receiving unit 40 is provided and the battery module in which the transmitting and receiving unit 40 is not provided. According to the present embodiment, the transmitting and receiving unit 40 is provided in only the battery module M1 among the five battery modules M1 to M5. Therefore, the battery monitoring unit 30 can be commonized among the battery modules M2 to M5 that are not provided with the transmitting and receiving unit 40.

Furthermore, according to the present embodiment, the battery monitoring unit 30 of each of the battery modules M1 to M5 assigns the identification information ID itself in the identification information generation process. Therefore, the identification information ID is not required to be set in advance in the battery monitoring unit 30 of each of the battery modules M1 to M5. Consequently, the battery monitoring unit 30 can be commonized among the battery modules M2 to M5.

According to the present embodiment, the transmitting and receiving unit 40 is provided in only the battery module M1 among the five battery modules M1 to M5. The transmitting and receiving unit 40 is not provided in the battery modules M2 to M5. Therefore, the number of transmitting and receiving units 40 in the battery system 100 can be reduced.

Second Embodiment

Figure 6:
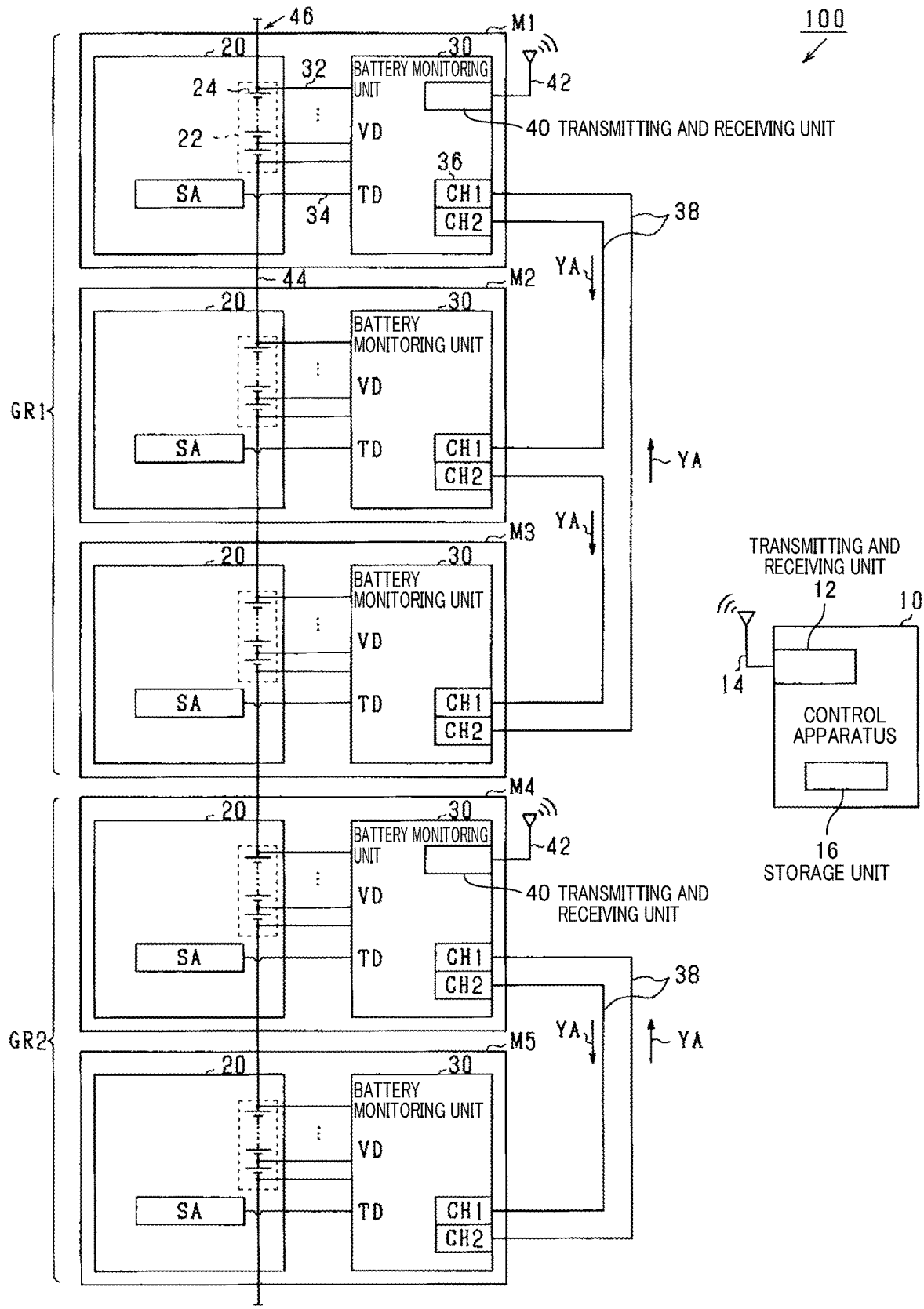
FIG. 6 is a configuration diagram of an overview of a power supply system of a vehicle according to a second embodiment.

A second embodiment will be described below with reference to FIGS. 6 to 8, mainly focusing on differences with the first embodiment. As shown in FIG. 6, the present embodiment differs from the first embodiment in that the battery modules M1 to M5 have two battery groups GR1 and GR2.

The first battery group GR1 is composed of the battery modules M1 to M3. In the first battery group GR1, the battery modules M1 to M3 are connected in a ring topology by the communication line 38. According to the present embodiment, the battery modules M1 to M3 are arranged such as to be arrayed in this order from the high-voltage side to the low-voltage side.

Signals, such as the command signal and the data signal, are transmitted among the battery modules M1 to M3 in the transmission direction YA from the battery module M1 on the high-voltage side toward the battery module M3 on the low-voltage side. A signal that is transmitted to the battery module M3 is transmitted between the battery modules M1 and M3 in the transmission direction YA from the battery module M3 on the low-voltage side toward the battery module M1 on the high-voltage side.

In the first battery group GR1, the transmitting and receiving unit 40 is provided in only the battery module M1 among the three battery modules M1 to M3 that are included in the first battery group GR1. In the battery modules M2 to M5 that are not provided with the transmitting and receiving unit 40, the battery monitoring unit 30 is commonized.

The second battery group GR2 is connected to the low-voltage side of the first battery group GR1 by a bus bar 44, and is composed of the battery modules M4 and M5. That is, the battery groups GR1 and GR2 include differing numbers of battery modules. In the second battery group GR2, the battery modules M4 and M5 are connected to each other by the communication line 38. The transmitting and receiving unit 40 is provided in only the battery module M4 of the two battery modules M4 and M5 that are included in the second battery group GR2.

In addition, the present embodiment differs from the first embodiment in that, in the identification information generation process, module quantity information IN that differs for each of the battery groups GR1 and GR2 is generated, and in the identification process, the battery groups GR1 and GR2 are identified using the module quantity information IN generated in the identification information generation process. Here, according to the present embodiment, the module quantity information IN corresponds to "group identification information".

FIGS. 7A and 7B show flowcharts of the identification process and the identification information generation process according to the present embodiment. In FIGS. 7A and 7B, regarding content that is identical to content shown in FIGS. 2A and 2B, above, same step numbers are given and descriptions are omitted for convenience. In the identification information generation process according to the present embodiment, when a positive determination is made at step S20, at step S60, a counting process is performed. In the counting process, quantities of the battery modules M1 to M5 that are included in the battery groups GR1 and GR2 are measured using the order of communication.

Specifically, when the ID assignment command is received, the battery module M1 sets the module quantity information IN that indicates the quantities of the battery modules included in the battery groups GR1 and GR2 to module quantity information IN of 1. The battery module M1 transmits the module quantity information IN of 1 to the battery module M2 on the low-voltage side.

Upon acquiring the module quantity information IN of 1, the battery module M2 increases the module quantity information IN of 1 by 1 and sets the module quantity information IN of 1 to module quantity information IN of 2. The battery module 2 then transmits the module quantity information IN of 2 to the battery module M3 on the low-voltage side. The battery module M3 similarly performs increase and transmission of the module quantity information IN. As a result, module quantity information IN of 3 is transmitted to the battery module M1. Here, this similarly applies to the second battery group GR2.

At subsequent step S62, a quantity data signal that includes the module quantity information IN of 3 is transmitted to the control apparatus 10. At subsequent step S64, whether a designated ID is received from the control apparatus 10 is determined.

When a negative determination is made at step S64, step S64 is repeated. Meanwhile, when a positive determination is made at step S64, the battery monitoring unit 30 proceeds to step S22. At step S22, the ID assignment process is performed using the designated ID received at step S64.

In addition, in the identification process according to the present embodiment, when the ID assignment command is transmitted to the battery monitoring unit 30 at step S10, at step S50, whether the quantity data signal is acquired from the battery monitoring unit 30 is determined.

When a negative determination is made at step S50, step S50 is repeated. Meanwhile, when a positive determination is made at step S50, at step S52, the battery group for which the quantity data signal is acquired is identified based on the module quantity information IN that is included in the quantity data signal acquired at step S50. Here, according to the present embodiment, the process at step S52 corresponds to a "group identifying unit".

At step S52, the control apparatus 10 identifies the battery groups GR1 and GR2 based on the module quantity information IN that is included in the quantity data signal acquired at step S50, using a map MP (see FIG. 8) that is stored in a storage unit 16 (see FIG. 6) of the control apparatus 10. Here, for example, the storage unit 16 is configured by a ROM, a rewritable non-volatile memory, or the like.

The map MP is correspondence information in which the battery groups GR1 and GR2 and the module quantity information IN are associated. In the map MP, the module quantity information corresponding to each of the battery groups GR1 and GR2 included in the battery system 100 is associated with the respective battery group GR1 or GR2 and stored.

At subsequent step S54, the identification information ID of the battery group of which the quantity data signal is acquired is designated based on an identification result at step S52. In the map MP, the identification information ID that is assigned to the battery modules of each of the battery groups GR1 and GR2 is associated with the respective battery group GR1 or GR2 and stored. At step S54, the control apparatus 10 designates the identification information ID using the map MP.

At subsequent step S56, the designated ID that is the identification information ID designated at step S54 is transmitted to the battery monitoring unit 30. As a result, at step S22, the battery monitoring unit 30 performs the ID assignment process using the designated ID, that is, the identification information ID that is designated by the control apparatus 10. That is, the battery monitoring unit 30 assigns the identification information ID based on the identification result at step S52. Here, according to the present embodiment, the process at step S22 corresponds to a "generating unit".

According to the present embodiment described above, the battery monitoring unit performs the ID assignment process using the designated ID. When a plurality of battery groups GR1 and GR2 are provided, the control apparatus 10 cannot identify the battery modules M1 to M5 if equivalent identification information ID is generated in the battery groups GR1 and GR2. According to the present embodiment, the control apparatus 10 identifies the battery groups GR1 and GR2 using the module quantity information IN, and the battery monitoring unit 30 generates the identification information ID based on the identification result. Therefore, equivalent identification information ID being generated in the battery groups GR1 and GR2 can be suppressed.

In particular, according to the present embodiment, the quantities of battery modules that are included in the battery groups GR1 and GR2 differ. The battery groups GR1 and GR2 are identified using the module quantity information IN that indicates the quantity. Therefore, the control apparatus 10 can favorably identify the battery groups GR1 and GR2 using the module quantity information IN. In addition, the module quantity information IN can be easily generated in the battery groups GR1 and GR2. Therefore, data for identifying the battery groups GR1 and GR2 is not required to be set separately from the module quantity information IN in the battery monitoring unit 30. The configuration of the battery monitoring unit 30 can be simplified.

According to the present embodiment, the battery modules M1 to M3 that are included in the battery group GR1 and the battery modules M4 and M5 that are included in the battery group GR2 are not connected by the communication line 38. Therefore, compared to the case in which all of the battery modules M1 to M5 are connected by the communication line 38, a degree of freedom in mounting of the battery modules M1 to M5 in the vehicle can be improved.

Third Embodiment

Figure 9:
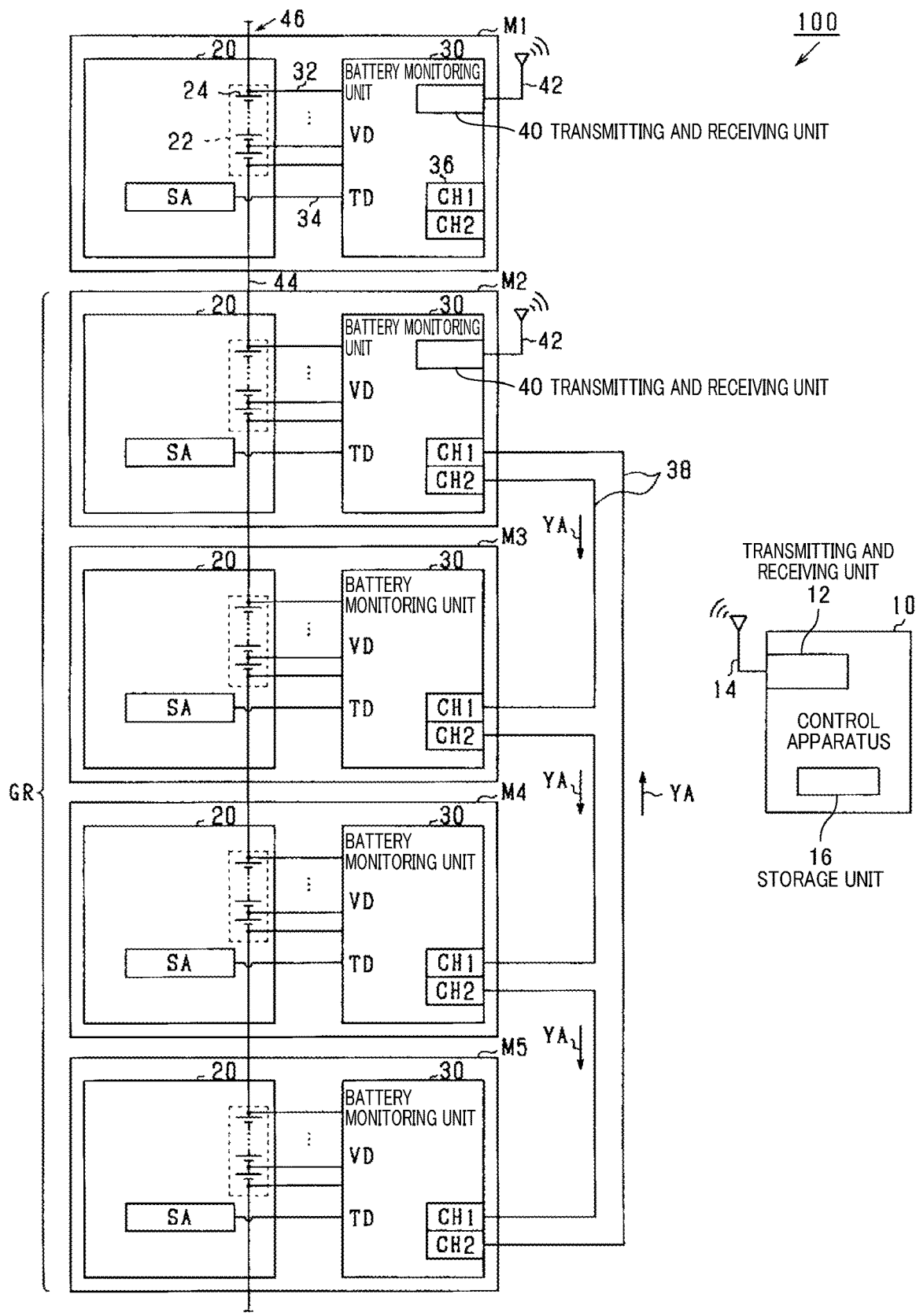
FIG. 9 is a configuration diagram of an overview of a power supply system of a vehicle according to a third embodiment.
Figure 10:
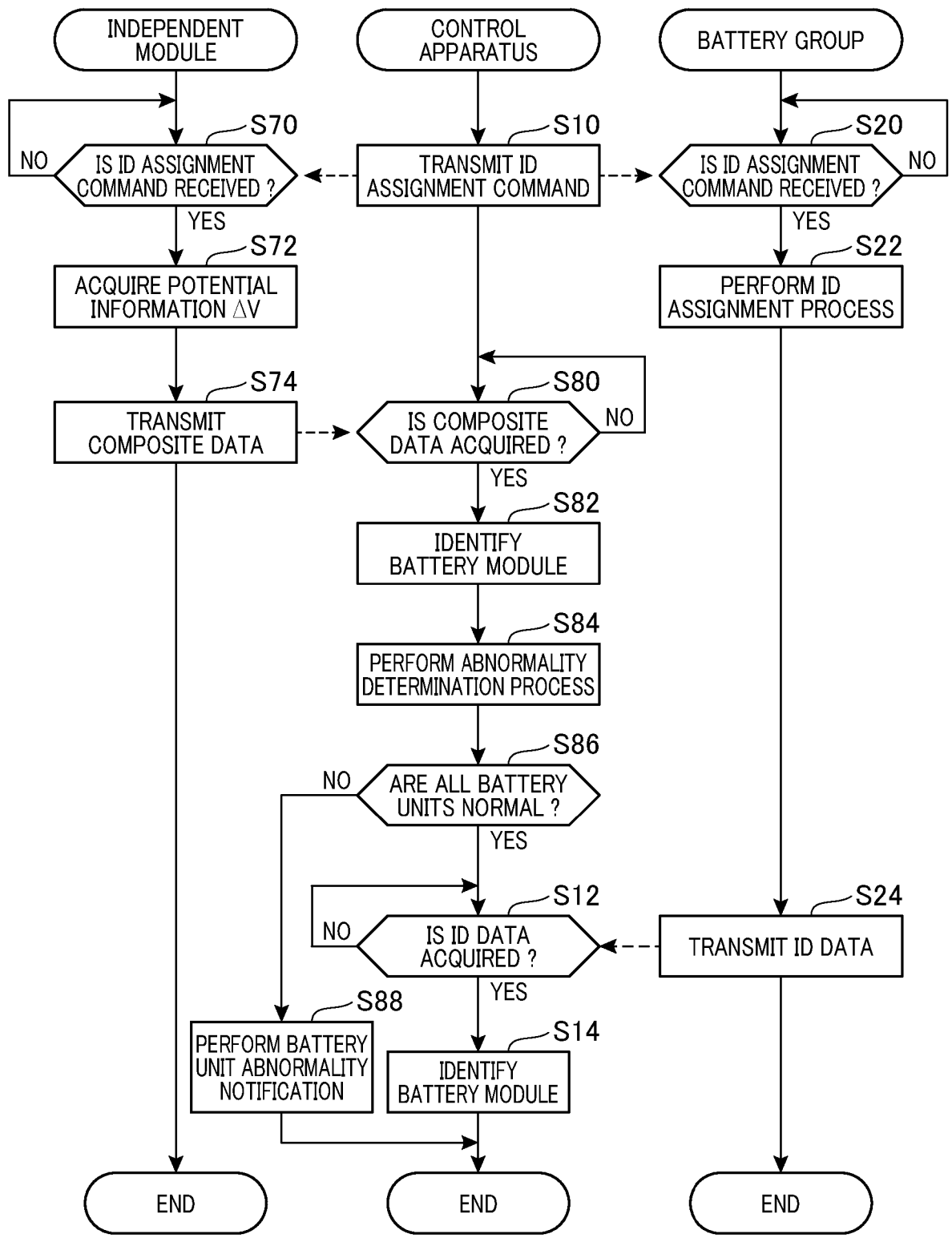
FIGS. 10A to 10C are flowcharts of an identification process, an identification information generation process, and a data generation process according to the third embodiment.
Figure 11:
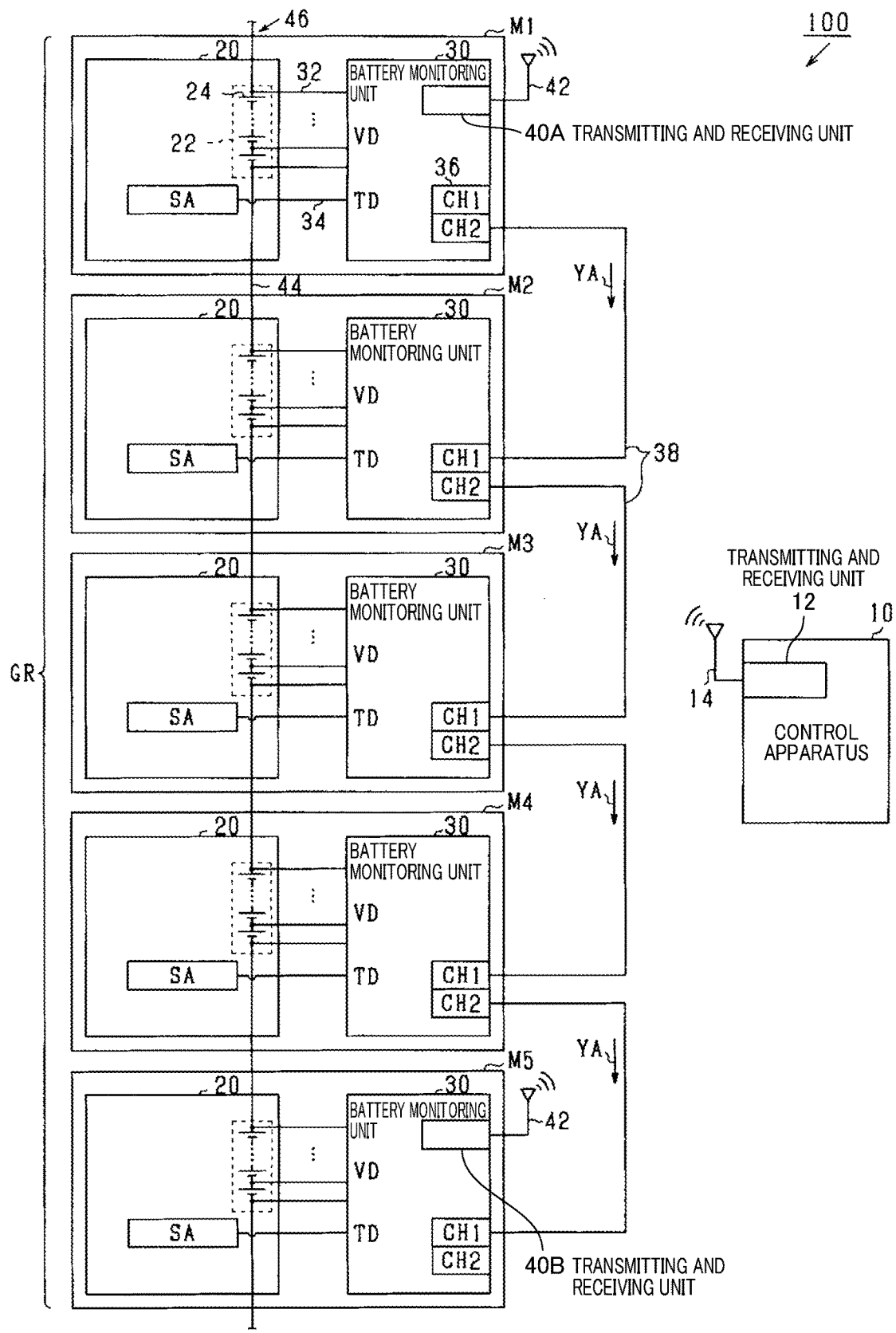
FIG. 11 is a configuration diagram of an overview of a power supply system of a vehicle according to another embodiment.

A third embodiment will be described below with reference to FIGS. 9 to 11, focusing mainly on the differences with the first embodiment. As shown in FIG. 8, the present embodiment differs in that the battery group GR is composed of the battery modules M2 to M5, and the battery modules M1 to M5 include the battery module M1 that is not included in the battery group GR. According to the present embodiment, the battery module M1 is referred to as an independent module M1. The independent module M1 is set to be the battery module M1 on the highest-voltage side among the battery modules M1 to M5.

The independent module M1 is provided with the transmitting and receiving unit 40 and independently wirelessly communicates with the control apparatus 10. Meanwhile, in the battery group GR, the transmitting and receiving unit 40 is provided in a single battery module M2 among the four battery modules M2 to M5 included in the battery group GR, and wirelessly communicates with the control apparatus 10 in battery group GR units. Specifically, in the battery group GR, when the data signals are transmitted to the control apparatus 10, the battery modules M1 to M5 generate the data signals by wired communication via the communication line 38.

In the independent module M1, such wired communication is unnecessary. Therefore, the data signal can be transmitted at an earlier stage compared to those of the battery group GR. The present embodiment differs from the first embodiment in that whether the battery unit 20 is normal is determined using a difference in transmission timings of the data signals.

FIGS. 10A to 10C show flowcharts of the identification process, the identification information generation process, and a data generation process according to the present embodiment. The data generation process is a process in which the potential information ΔV is acquired, and a composite data signal that includes the identification information ID and the potential information ΔV is generated. The data generation process is performed by the battery monitoring unit 30 of the independent module M1.

FIG. 10A shows a flowchart of the identification process by the control apparatus 10. FIG. 10B shows a flowchart of the identification information generation process by the battery monitoring unit 30 of the battery group GR. FIG. 10C shows a flowchart of the data generation process by the battery monitoring unit 30 of the independent module M1. In FIGS. 10A to 10C, regarding content that is identical to content shown in FIGS. 2A and 2B, above, same step numbers are given and descriptions are omitted for convenience.

The data generation process will be described. When the data generation process is started, first, at step S70, battery monitoring unit 10 of the independent module M1 determines whether the ID assignment command is received from the control apparatus 10.

When a negative determination is made at step S70, step S70 is repeated. Meanwhile, when a positive determination is made at step S70, at step S72, the potential information ΔV of the independent module M1 is acquired. The battery monitoring unit 30 of the independent module M1 acquires the ground voltage and acquires a positive electrode voltage of the battery cell 24 on the highest-voltage side among the voltages of the assembled battery 22 of the independent module M1. The battery monitoring unit 30 of the independent module M1 then acquires the potential information ΔV that indicates a voltage difference between these voltages. Here, the ground voltage according to the present embodiment corresponds to a "predetermined reference voltage".

At subsequent step S24, the composite data signal that includes the potential information V acquired at step S72 and the identification information ID of the independent module M1 is transmitted to the control apparatus 10 and the data generation process is ended.

Next, the identification process will be described. In the identification process according to the present embodiment, when the ID assignment command is transmitted to the battery monitoring unit 30 at step S10, at step S80, whether the composite data signal is acquired from the battery monitoring unit 30 of the independent module M1 is determined. When a negative determination is made at step S80, step S80 is repeated.

Meanwhile, when a positive determination is made at step S80, at step S82, the independent module M1 is identified based on the identification information ID that is included in the composite data signal acquired at step S80. At subsequent step S84, an abnormality determination process for the battery units 20 of the battery modules M1 to M5 is performed using the potential information ΔV that is included in the composite data signal acquired at step S80. Here, according to the present embodiment, the process at step S84 corresponds to a "determining unit".

At step S84, the control apparatus 10 determines an abnormality in the battery units of the battery modules M1 to M5 based on the potential information ΔV that is included in the composite data signal acquired at step S80, using a predetermined potential range of the battery unit 20 that is stored in the storage unit 16 of the control apparatus 10. According to the present embodiment, the independent module M1 is set to the battery module M1 on the highest-voltage side among the battery modules M1 to M5.

Therefore, when an abnormality is present in at least a single battery unit 20 of the battery modules M1 to M5, the potential information ΔV falls outside the predetermined potential range. When all of the battery units 20 of the battery modules M1 to M5 are normal, the potential information ΔV is included in the predetermined potential range. At subsequent step S86, whether all of the battery units 20 of the battery modules M1 to M5 are normal is determined.

When a negative determination is made at step S86, at step S88, notification regarding an occurrence of an abnormality in the battery unit 20 is issued and the identification process is ended. When an abnormality in the battery unit 20 occurs, the control apparatus 10 cannot appropriately acquire the voltages of the assembled batteries 22 of the battery modules M1 to M5, and cannot appropriately control the battery modules M1 to M5. Therefore, when an abnormality in the battery unit 20 occurs, the vehicle is not started in a normal manner. Here, as a notification method for the occurrence of an abnormality in the battery unit 20, there are methods such as a warning sound being generated, the abnormality being displayed in a display of a car navigation apparatus, or the like.

Meanwhile, when a positive determination is made at step S86, the control apparatus proceeds to step S12. At step S12, whether the ID data signal that is transmitted from the battery monitoring unit 30 of the battery group GR is acquired later than the composite data signal is determined. That is, the control apparatus 10 determines whether the battery units of the battery modules M1 to M5 are normal based on the potential information ΔV that is acquired from the independent module M1, before acquiring the ID data signal from the battery group GR after acquiring the composite data signal from the independent module M1.

According to the present embodiment described above, the control apparatus 10 performs the abnormality determination process regarding the battery units 20 based on the composite data signal that is acquired from the independent module M1. The independent module M1 that is not included in the battery group GR is not required to perform wired communication with the battery modules. Therefore, the independent module M1 can transmit the composite data signal to the control apparatus 10 at an earlier stage than the ID data signal from the battery group GR. The control apparatus 10 determines whether the battery units 20 of the battery modules M1 to M5 are normal based on the composite data signal that is acquired at an early stage. Therefore, whether these battery units 20 are normal can be determined at an early stage.

In particular, according to the present embodiment, the battery units 20 of the battery modules M1 to M5 are connected in series and configure the serial connection body 46. Therefore, voltage variations in the battery unit 20 of the independent module M1 affect the potential of the battery unit 20 of the other battery modules M2 to M5. In contrast, voltage variations in the battery units 20 of the other battery modules M2 to M5 affect the potential of the battery unit 20 of the independent module M1. Therefore, whether the battery units 20 of the battery modules M1 to M5 are normal can be determined based on the potential information ΔV acquired by the independent module M1.

Other Embodiments

The above-described embodiments may be modified in the following manner.

The quantity of the battery modules is not limited to five, and may be two to four, or six or more.

An example in which the wireless receiving unit and the wireless transmitting unit are the transmitting and receiving unit 40 in which the wireless receiving unit and the wireless transmitting unit are integrated is given. However, this is not limited thereto. The wireless receiving unit and the wireless transmitting unit may be separately provided.

An example in which the transmission direction YA of signals, such as the command signal and the data signal, is the direction from the battery module on the high-voltage side toward the battery module on the low-voltage side is given. However, this is not limited thereto. The direction may be from the battery module on the low-voltage side toward the battery module on the high-voltage side.

According to the first embodiment, an example in which the wireless receiving unit and the wireless transmitting unit are both provided in a single battery module is given. However, this is not limited thereto. The wireless receiving unit and the wireless transmitting unit may be provided in separate battery modules.

According to the first embodiment, an example in which the battery modules M1 to M5 are connected in a ring topology by the communication line 38 is given. However, this is not limited thereto. For example, as shown in FIG. 11, the battery monitoring units 30 of the battery modules M1 to M5 may be connected in series by the communication line 38.

The battery monitoring units 30 of the battery modules M1 to M5 transmit signals, such as the command signals and the data signals, from the battery module M1 on one end side in which a wireless receiving unit 40A is provided toward the battery module M5 on the other end side in which a wireless transmitting unit 40B is provided. That is, in the battery group GR, the order of communication for wired communication is prescribed in advance. Therefore, the identification information ID can be assigned to the battery modules M1 to M5 using this order.

In addition, the battery module M1 and the battery module M5 are not connected by the communication line 38. Therefore, a number of communication lines 38 in the battery system 100 can be reduced.

According to the second embodiment, the number of battery groups GR is not limited to two and may be three or more. In addition, an example in which the quantities of the battery modules included in the battery groups GR differ is given. However, this is not limited thereto. The quantities of the battery modules included in the battery groups GR may be equal.

In this case, the module quantity information IN cannot be used as the module identification information. Therefore, information regarding the wireless receiving unit or the wireless transmitting unit may be used as the module identification information. In each battery group GR, specification of at least either of the wireless receiving unit and the wireless transmitting unit is set to differ, and the battery monitoring unit 30 transmits individual information indicating the specification to the control apparatus 10 as the module identification information. As a result, the battery groups GR can be identified using the individual information.

When the individual information is set to differ, the battery monitoring unit 30 of the battery module in which the wireless receiving unit and the wireless transmitting unit are provided cannot be commonized. Meanwhile, the battery monitoring units 30 can be commonized in the battery modules in which the wireless receiving unit and the wireless transmitting unit are not provided.

According to the second embodiment, an example in which the battery group GR and the module quantity information IN are associated in the map MPis given. However, this is not limited thereto. For example, as shown in FIGS. 5A to 5F, voltage information that indicates whether the battery group GR is a battery group on the high-voltage side or battery modules on the low-voltage side, and the module quantity information IN may be associated.

In addition, for example, the identification information ID may be designated based on the voltage information such that the identification information ID of a battery module that is included in the battery group on the high-voltage side is identification information that is smaller than the identification information ID of a battery module that is included in the battery group on the low-voltage side.

According to the third embodiment, the number of independent modules is not limited to one and may be two or more. In addition, an example in which the independent module is set to the battery module M1 on the highest-voltage side among the battery modules M1 to M5 is given. However, this is not limited thereto. The independent module may be set to other battery modules M2 to M5.

According to the third embodiment, an example in which the information that is transmitted to the control apparatus 10 by the independent module M1 and used to determine whether the battery units 20 are normal is the potential information $\Delta V$ is given. However, this is not limited thereto. For example, the information may be information indicating the temperature data TD.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

What is claimed is:

1. A battery system comprising:
a plurality of battery modules, each of the plurality of battery modules including a battery unit and a battery monitoring unit; and
a control apparatus, wherein:
the plurality of battery modules comprises a battery group that includes two or more battery modules including battery units and battery monitoring units, the battery monitoring units of the two or more battery modules in the battery group being connected to each other via a communication line, the two or more battery modules in the battery group performing wired communication via the communication line;
the battery group further includes
a wireless receiving unit that wirelessly receives a command signal that is transmitted from the control apparatus, and
a wireless transmitting unit that wirelessly transmits, to the control apparatus, a data signal that includes module identification information that differs for each battery module;
in the battery group, the wireless receiving unit is provided in a single battery module of the two or more battery modules and the wireless transmitting unit is provided in a single battery module of the two or more battery modules;
in the battery group, the battery monitoring units of the two or more battery modules are connected in a ring topology via the communication line; and
the battery monitoring units of the two or more battery modules in the battery group transmit the command signal and the data signal in a predetermined transmission direction using the communication line that is arranged in the ring topology.

2. The battery system according to claim 1, wherein:
the battery group includes three or more battery modules; and
the wireless receiving unit and the wireless transmitting unit are both provided in a single battery module among the three or more battery modules.

3. The battery system according to claim 1, wherein:
in the battery group, the battery monitoring units of the two or more battery modules are connected in series via the communication line; and
the battery monitoring units transmit the command signal and the data signal from the battery module on one side that is provided with the wireless receiving unit toward the battery module on another side that is provided with the wireless transmitting unit.

4. A battery system comprising:
a plurality of battery modules, each of the plurality of battery modules including a battery unit and a battery monitoring unit; and
a control apparatus, wherein:
the plurality of battery modules comprises a battery group that includes two or more battery modules including battery units and battery monitoring units, the battery monitoring units of the two or more battery modules in the battery group being connected to each other via a communication line, the two or more battery modules in the battery group performing wired communication via the communication line;
the battery group further includes
a wireless receiving unit that wirelessly receives a command signal that is transmitted from the control apparatus, and
a wireless transmitting unit that wirelessly transmits, to the control apparatus, a data signal that includes module identification information that differs for each battery module;
in the battery group, the wireless receiving unit is provided in a single battery module of the two or more battery modules and the wireless transmitting unit is provided in a single battery module of the two or more battery modules;
the plurality of battery modules includes an independent module that is a battery module that is not included in the battery group;
the independent module includes the wireless receiving unit and the wireless transmitting unit; and
the control apparatus includes a determining unit that determines whether the battery units of the plurality of battery modules are normal based on the data signal that is acquired from the independent module, before the data signals are acquired from the battery group after the data signal is acquired from the independent module.

5. The battery system according to claim 4, wherein:
the plurality of battery modules have a series connection body in which the battery units are connected to each other in series;
the data signal acquired from the independent module includes potential information that indicates a potential of the battery unit of the independent module relative to a predetermined reference voltage of the series connection body; and
the determining unit determines whether the battery units of the plurality of battery modules are normal based on the potential information.

6. The battery system according to claim 1, wherein: A battery system comprising:
a plurality of battery modules, each of the plurality of battery modules including a battery unit and a battery monitoring unit; and
a control apparatus, wherein:
the plurality of battery modules comprises a battery group that includes two or more battery modules including battery units and battery monitoring units, the battery monitoring units of the two or more battery modules in the battery group being connected to each other via a communication line, the two or more battery modules in the battery group performing wired communication via the communication line;
the battery group further includes
a wireless receiving unit that wirelessly receives a command signal that is transmitted from the control apparatus, and
a wireless transmitting unit that wirelessly transmits, to the control apparatus, a data signal that includes module identification information that differs for each battery module;
in the battery group, the wireless receiving unit is provided in a single battery module of the two or more battery modules and the wireless transmitting unit is provided in a single battery module of the two or more battery modules;
the plurality of battery modules comprise a plurality of the battery groups;
the data signal acquired from each of the plurality of battery groups includes group identification information that differs for each of the plurality of battery groups;
the control apparatus includes a group identifying unit that identifies each of the plurality of battery groups based on the group identification information; and
the battery monitoring unit of the battery module included in each battery group includes a generating unit that generates the module identification information based on an identification result from the group identifying unit.

7. The battery system according to claim 6, wherein:
the plurality of battery groups include differing quantities of battery modules; and
the group identification information is information that indicates a quantity of battery modules included in each of the plurality of battery groups.

8. The battery system according to claim 1, wherein:
the plurality of battery modules includes an independent module that is a battery module that is not included in the battery group;
the independent module includes the wireless receiving unit and the wireless transmitting unit; and
the control apparatus includes a determining unit that determines whether the battery units of the plurality of battery modules are normal based on the data signal that is acquired from the independent module, before the data signals are acquired from the battery group after the data signal is acquired from the independent module.

9. The battery system according to claim 2, wherein:
the plurality of battery modules includes an independent module that is a battery module that is not included in the battery group;

the independent module includes the wireless receiving unit and the wireless transmitting unit; and the control apparatus includes a determining unit that determines whether the battery units of the plurality of battery modules are normal based on the data signal that is acquired from the independent module, before the data signals are acquired from the battery group after the data signal is acquired from the independent module.

10. The battery system according to claim 3, wherein:

the plurality of battery modules includes an independent module that is a battery module that is not included in the battery group;

the independent module includes the wireless receiving unit and the wireless transmitting unit; and the control apparatus includes a determining unit that determines whether the battery units of the plurality of battery modules are normal based on the data signal that is acquired from the independent module, before the data signals are acquired from the battery group after the data signal is acquired from the independent module.

11. The battery system according to claim 1, wherein:

the plurality of battery modules comprise a plurality of the battery groups;

the data signal acquired from each of the plurality of battery groups includes group identification information that differs for each of the plurality of battery groups;

the control apparatus includes a group identifying unit that identifies each of the plurality of battery groups based on the group identification information; and the battery monitoring unit of the battery module included in each battery group includes a generating unit that generates the module identification information based on an identification result from the group identifying unit.

12. The battery system according to claim 2, wherein:

the plurality of battery modules comprise a plurality of the battery groups;

the data signal acquired from each of the plurality of battery groups includes group identification information that differs for each of the plurality of battery groups;

the control apparatus includes a group identifying unit that identifies each of the plurality of battery groups based on the group identification information; and the battery monitoring unit of the battery module included in each battery group includes a generating unit that generates the module identification information based on an identification result from the group identifying unit.

13. The battery system according to claim 3, wherein:

the plurality of battery modules comprise a plurality of the battery groups;

the data signal acquired from each of the plurality of battery groups includes group identification information that differs for each of the plurality of battery groups;

the control apparatus includes a group identifying unit that identifies each of the plurality of battery groups based on the group identification information; and the battery monitoring unit of the battery module included in each battery group includes a generating unit that generates the module identification information based on an identification result from the group identifying unit.

14. The battery system according to claim 4, wherein:

the plurality of battery modules comprise a plurality of the battery groups;

the data signal acquired from each of the plurality of battery groups includes group identification information that differs for each of the plurality of battery groups;

the control apparatus includes a group identifying unit that identifies each of the plurality of battery groups based on the group identification information; and the battery monitoring unit of the battery module included in each battery group includes a generating unit that generates the module identification information based on an identification result from the group identifying unit.

15. The battery system according to claim 5, wherein:

the plurality of battery modules comprise a plurality of the battery groups;

the data signal acquired from each of the plurality of battery groups includes group identification information that differs for each of the plurality of battery groups;

the control apparatus includes a group identifying unit that identifies each of the plurality of battery groups based on the group identification information; and the battery monitoring unit of the battery module included in each battery group includes a generating unit that generates the module identification information based on an identification result from the group identifying unit.

* * * * *